United States Patent
Miwa et al.

(10) Patent No.: US 12,245,511 B2
(45) Date of Patent: Mar. 4, 2025

(54) PIEZOELECTRIC CERAMIC ELECTRONIC COMPONENT

(71) Applicant: Murata Manufacturing Co., Ltd., Nagaokakyo (JP)

(72) Inventors: Yasunari Miwa, Nagaokakyo (JP); Hiroyuki Sumioka, Nagaokakyo (JP); Hiroyuki Hayashi, Nagaokakyo (JP); Hirozumi Ogawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 804 days.

(21) Appl. No.: 17/508,567

(22) Filed: Oct. 22, 2021

(65) Prior Publication Data

US 2022/0052252 A1    Feb. 17, 2022

Related U.S. Application Data

(63) Continuation of application No. PCT/JP2020/011940, filed on Mar. 18, 2020.

(30) Foreign Application Priority Data

May 14, 2019    (JP) .................... 2019-091326

(51) Int. Cl.
*H10N 30/853* (2023.01)
*H10N 30/00* (2023.01)
(Continued)

(52) U.S. Cl.
CPC ....... *H10N 30/8542* (2023.02); *H10N 30/097* (2023.02); *H10N 30/50* (2023.02); *H10N 30/704* (2024.05)

(58) Field of Classification Search
CPC .. H10N 30/8542; H10N 30/097; H10N 30/50; H10N 30/704; C04B 35/495
See application file for complete search history.

(56) References Cited

U.S. PATENT DOCUMENTS

| | | |
|---|---|---|
| 2009/0243439 A1 | 10/2009 | Furukawa et al. |
| 2010/0102679 A1 | 4/2010 | Kawada |
| (Continued) | | |

FOREIGN PATENT DOCUMENTS

| | | |
|---|---|---|
| JP | 2009242167 A | 10/2009 |
| JP | 2011091234 A | 5/2011 |
| (Continued) | | |

OTHER PUBLICATIONS

International Search Report issued for PCT/JP2020/011940, date of mailing Jun. 2, 2020.

*Primary Examiner* — J. San Martin
(74) *Attorney, Agent, or Firm* — ArentFox Schiff LLP

(57) ABSTRACT

A piezoelectric ceramic electronic component that includes a piezoelectric ceramic body including at least one piezoelectric ceramic layer; and a plurality of electrodes on a surface or inside of the piezoelectric ceramic body and arranged so that the at least one piezoelectric ceramic layer is sandwiched between adjacent electrodes of the plurality of electrodes. The at least one piezoelectric ceramic layer is a ceramic sintered body containing a potassium sodium niobate-based compound and Mn. When the at least one piezoelectric ceramic layer sandwiched between the adjacent electrodes is divided into three equal parts in a thickness direction to sequentially define a first region, a second region, and a third region between the adjacent electrodes, a second Mn concentration in the second region is higher than a first Mn concentration in the first region and a third Mn concentration in the third region.

12 Claims, 8 Drawing Sheets

(51) Int. Cl.
*H10N 30/097* (2023.01)
*H10N 30/50* (2023.01)

(56) References Cited

U.S. PATENT DOCUMENTS

2014/0028156 A1 1/2014 Shimizu et al.
2015/0194592 A1 7/2015 Aida et al.
2018/0159020 A1 6/2018 Sakuma et al.

FOREIGN PATENT DOCUMENTS

| JP | 2014107563 A | | 6/2014 |
| JP | 2014139132 A | | 7/2014 |
| JP | 2015070136 A | | 4/2015 |
| JP | 2018093144 A | | 6/2018 |
| JP | 2021005627 A | * | 1/2021 |

\* cited by examiner

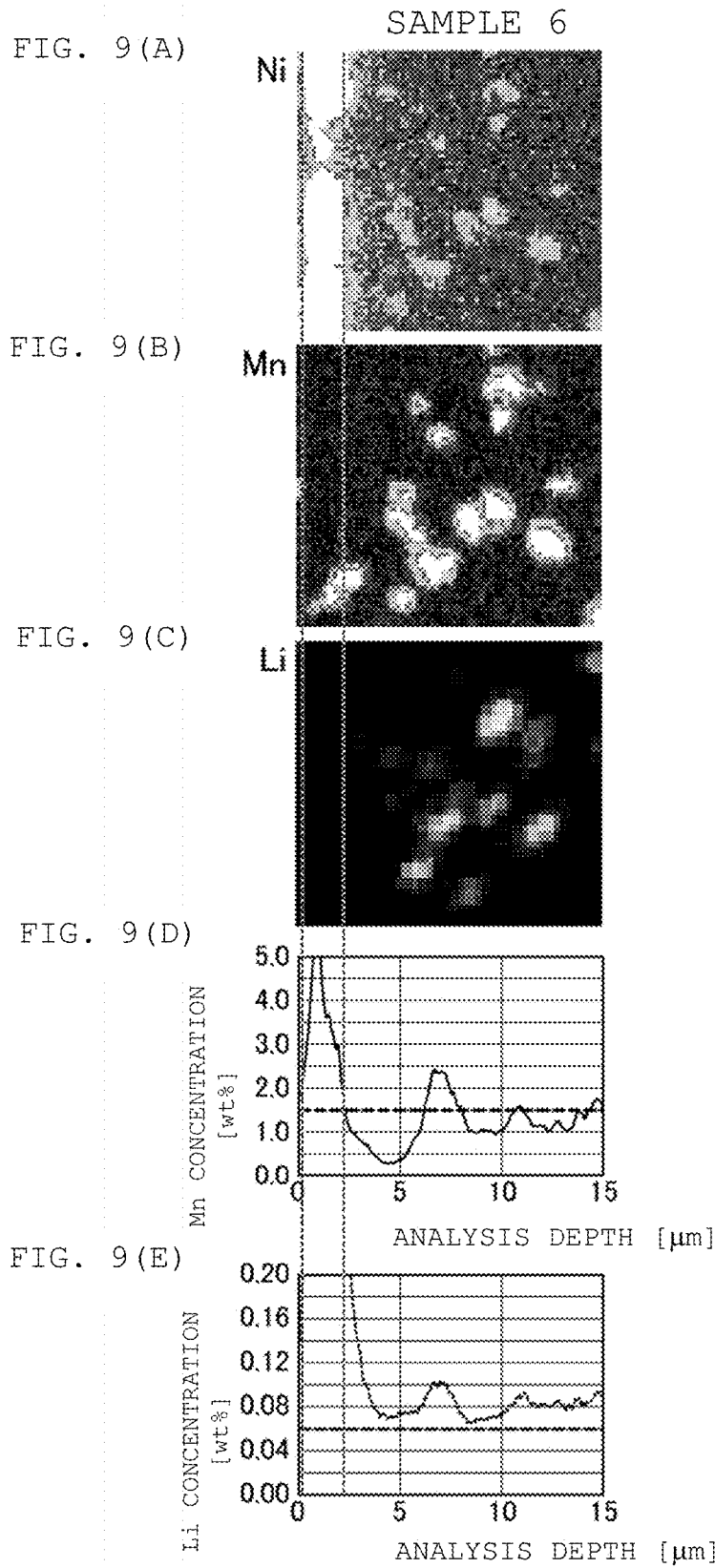

SAMPLE 3
FIG. 10(A) Ni
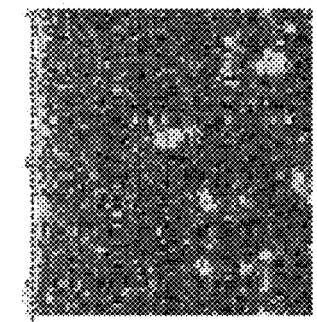
FIG. 10(B) Mn
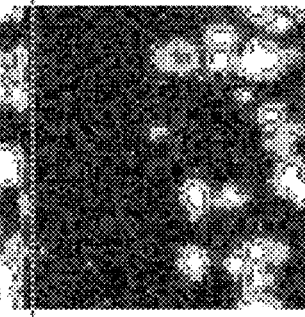
FIG. 10(C) Li
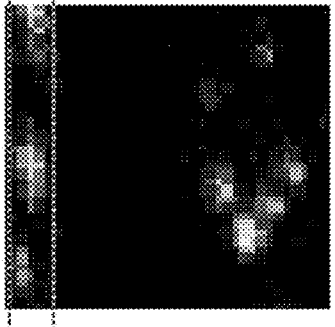
FIG. 10(D)
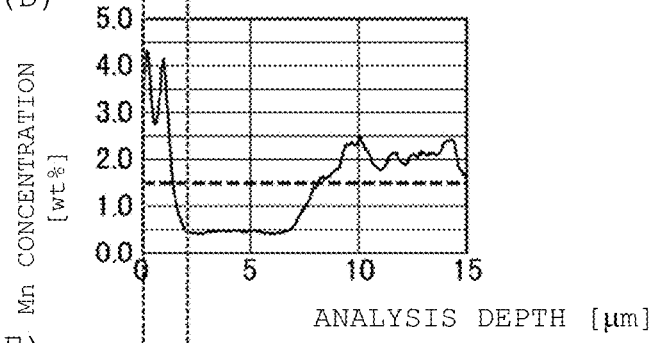
FIG. 10(E)
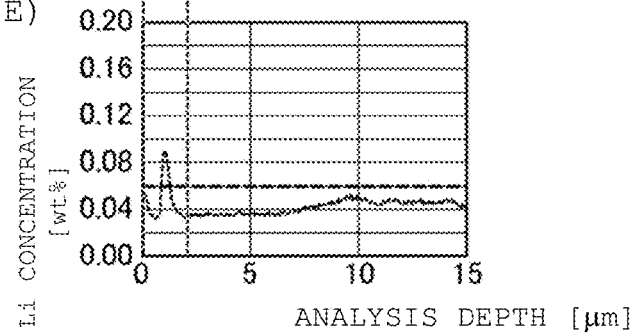

PIEZOELECTRIC CERAMIC ELECTRONIC COMPONENT

CROSS REFERENCE TO RELATED APPLICATIONS

The present application is a continuation of International application No. PCT/JP2020/011940, filed Mar. 18, 2020, which claims priority to Japanese Patent Application No. 2019-091326, filed May 14, 2019, the entire contents of each of which are incorporated herein by reference.

FIELD OF THE INVENTION

The present invention relates to a piezoelectric ceramic electronic component.

BACKGROUND OF THE INVENTION

In the related art, a piezoelectric ceramic electronic component such as an ultrasonic sensor, a piezoelectric buzzer, or a piezoelectric actuator using a piezoelectric material has been widely known. In addition, there is an increasing demand for a piezoelectric ceramic electronic component capable of acquiring a large displacement amount with a small voltage.

As the piezoelectric material, a lead zirconate titanate-based compound represented by General Formula: $Pb(Zr, Ti)O_3$ has been used so far. In recent years, as a lead-free piezoelectric material, a potassium sodium niobate (KNN)-based compound represented by General Formula $(K,Na)NbO_3$ has attracted attention.

Patent Document 1 discloses a piezoelectric ceramic electronic component including a piezoelectric ceramic body formed by alternately stacking and sintering an internal electrode and a piezoelectric ceramic layer, in which an external electrode is formed on a surface of the piezoelectric ceramic body. In the piezoelectric ceramic electronic component disclosed in Patent Document 1, the internal electrode contains Ni as a main component, and the piezoelectric ceramic layer is formed of a piezoelectric ceramic composition represented by $[100\{(1-x)(K_{1-a-b}Na_aLi_b)(Nb_{1-c}Ta_c)O_3-xM2M4O_3\}+\alpha Mn+\beta M4]$ (where, x, a, b, c, $\alpha$, and $\beta$ satisfy $0.005 \leq x \leq 0.1$, $0 \leq a \leq 0.9$, $0 \leq b \leq 0.1$, $0 \leq a+b \leq 0.9$, $0 \leq c \leq 0.3$, $2 \leq \alpha \leq 15$, and $0.1 \leq \beta \leq 5.0$, respectively.).

Patent Document 2 discloses a piezoelectric ceramic electronic component in which an external electrode is formed on a surface of a piezoelectric ceramic body. In the piezoelectric ceramic electronic component disclosed in Patent Document 2, the piezoelectric ceramic body is formed of an alkali niobate compound having a perovskite-type structure as a main component, contains Ga as an accessory component, and contains at least one element of Nd and Dy, the piezoelectric ceramic body is divided into a surface layer portion region and a surface layer outer region excluding the surface layer portion region, and in the surface layer portion region, a total of a molar ratio Ga to Nb, a molar ratio Nd to Nb, and a molar ratio Dy to Nb is larger than that in the surface layer outer region. Further, Patent Document 2 discloses that the ceramic body preferably contains Mn as an accessory component.

Patent Document 3 discloses a piezoelectric thin film laminate including a first electrode layer, a first oxide layer stacked on the first electrode layer, a second oxide layer stacked on the first oxide layer, and a piezoelectric thin film stacked on the second oxide layer. In the piezoelectric thin film laminate disclosed in Patent Document 3, the electrical resistivity of the first oxide layer is higher than the electrical resistivity of the second oxide layer, the first oxide layer contains K, Na, and Nb, and the piezoelectric thin film contains $(K, Na))NbO_3$.

In the piezoelectric ceramic electronic components disclosed in Patent Documents 1 and 2, a piezoelectric ceramic layer or a piezoelectric ceramic body is formed by firing. On the other hand, in the piezoelectric thin film laminate disclosed in Patent Document 3, a piezoelectric thin film is formed by a thin film forming method such as a sputtering method or a chemical vapor deposition method.

Patent Document 1: Japanese Patent Application Laid-Open No. 2014-139132
Patent Document 2: Japanese Patent Application Laid-Open No. 2015-70136
Patent Document 3: Japanese Patent Application Laid-Open No. 2018-93144

SUMMARY OF THE INVENTION

As disclosed in Patent Documents 1 and 2, when a piezoelectric ceramic layer and a conductive layer to be an internal electrode are alternately stacked and co-fired to manufacture a piezoelectric ceramic electronic component, co-firing needs to be performed in a reducing atmosphere in order to prevent oxidation of Ni used as a material of the internal electrode.

According to Patent Document 1, when a potassium sodium niobate-based compound as a piezoelectric material is fired in a reducing atmosphere, oxygen vacancies (hereinafter, referred to as an oxygen defect) are likely to be formed therein, which causes sintering defects. For this problem, Patent Documents 1 and 2 disclose that Mn is added to a potassium sodium niobate-based compound to dissolve Mn in the potassium sodium niobate-based compound, thereby improving sinterability in a reducing atmosphere.

Furthermore, since oxygen defects formed inside the potassium sodium niobate-based compound gradually move to the negative electrode side by application of a direct current (DC) voltage or a bias alternating current (AC) voltage, there is a risk of causing a decrease in insulation resistance. Also for this problem, it is considered that when Mn is added to the potassium sodium niobate-based compound to dissolve Mn in the potassium sodium niobate-based compound, Mn forms an electrical pair with oxygen defects and hinders movement of oxygen defects, so that a decrease in the insulation resistance can be suppressed.

As described above, in the piezoelectric ceramic electronic component, Mn added to the potassium sodium niobate-based compound plays an important role. Here, when a piezoelectric thin film is formed by a thin film forming method as disclosed in Patent Document 3, the concentration of elements contained in each layer can be adjusted. On the other hand, when a piezoelectric ceramic layer is formed by firing as disclosed in Patent Documents 1 and 2, it is difficult to control the concentration of elements contained in the piezoelectric ceramic layer because elements such as Mn diffuse during firing, and alkali metal elements such as K and Na volatilize. Therefore, it can be said that there is room for improvement in the piezoelectric ceramic electronic component including the ceramic sintered body in terms of suppressing a decrease in insulation resistance.

The present invention has been made to solve the above problems, and an object of the present invention is to provide a piezoelectric ceramic electronic component including a piezoelectric ceramic layer formed of a ceramic sintered body and capable of suppressing a decrease in the insulation resistance although it is driven for a long time.

A piezoelectric ceramic electronic component according to the present invention includes a piezoelectric ceramic body including at least one piezoelectric ceramic layer; and a plurality of electrodes on a surface of or inside the piezoelectric ceramic body and arranged so that the at least one piezoelectric ceramic layer is sandwiched between adjacent electrodes of the plurality of electrodes. The at least one piezoelectric ceramic layer is a ceramic sintered body containing a potassium sodium niobate-based compound and Mn. When the at least one piezoelectric ceramic layer sandwiched between the adjacent electrodes is divided into three equal parts in a thickness direction to sequentially define a first region, a second region, and a third region between the adjacent electrodes, a second Mn concentration in the second region is higher than a first Mn concentration in the first region and a third Mn concentration in the third region.

According to the present invention, it is possible to provide a piezoelectric ceramic electronic component including a piezoelectric ceramic layer formed of a ceramic sintered body and capable of suppressing a decrease in the insulation resistance although it is driven for a long time.

BRIEF DESCRIPTION OF THE DRAWINGS

FIG. 9(A) is a Ni mapping image, FIG. 9(B) is a Mn mapping image, FIG. 9(C) is a Li mapping image, FIG. 9(D) is a graph illustrating a distribution of a Mn concentration, and FIG. 9(E) is a graph illustrating a distribution of a Li concentration.

FIG. 10(A) is a Ni mapping image, FIG. 10(B) is a Mn mapping image, FIG. 10(C) is a Li mapping image, FIG. 10(D) is a graph illustrating a distribution of a Mn concentration, and FIG. 10(E) is a graph illustrating a distribution of a Li concentration.

DETAILED DESCRIPTION OF THE INVENTION

Hereinafter, a piezoelectric ceramic electronic component according to the present invention will be described.

However, the present invention is not limited to the following configuration, and can be appropriately modified and applied without changing the gist of the present invention. The present invention also includes a combination of two or more of individual desirable configurations described below.

A piezoelectric ceramic electronic component according to the present invention includes a piezoelectric ceramic body including at least one piezoelectric ceramic layer (or a plurality of piezoelectric ceramic layers), and a plurality of electrodes on a surface of or inside the piezoelectric ceramic body and arranged so that the at least one piezoelectric ceramic layer is sandwiched between adjacent electrodes of the plurality of electrodes. In the following description, an electrode provided on the surface of the piezoelectric ceramic body is referred to as an external electrode, and an electrode provided inside the piezoelectric ceramic body is referred to as an internal electrode.

In the embodiment described below, the piezoelectric ceramic electronic component includes a plurality of external electrodes and a plurality of internal electrodes as electrodes. The piezoelectric ceramic electronic component according to the present invention may include a plurality of internal electrodes, or may include a single layer of internal electrodes. Further, the piezoelectric ceramic electronic component of the present invention may include only a plurality of external electrodes without including the internal electrodes. In a case where the piezoelectric ceramic electronic component according to the present invention does not include an internal electrode, the piezoelectric ceramic body includes one piezoelectric ceramic layer.

[Piezoelectric Ceramic Electronic Component]

Figure 1:
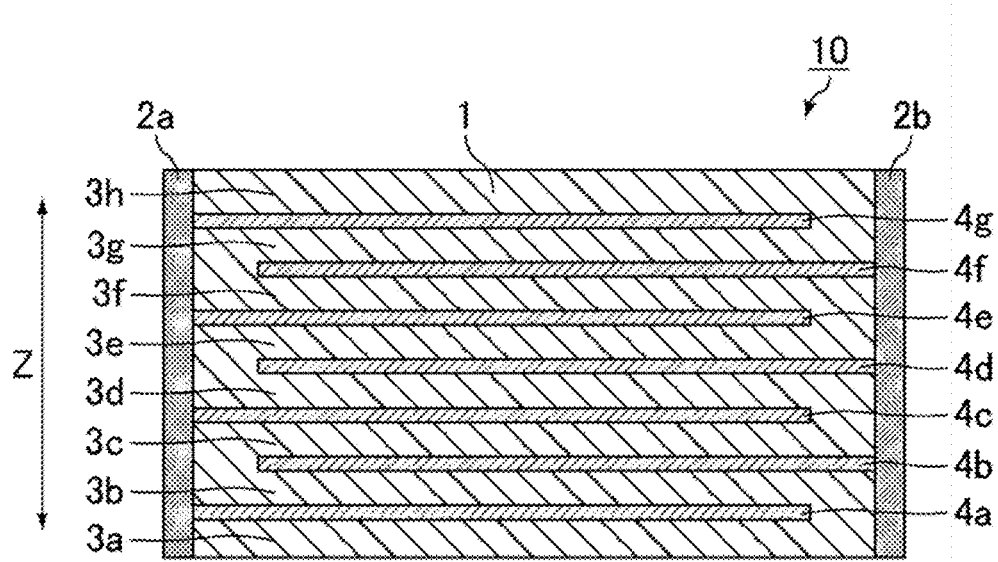
FIG. 1 is a sectional view schematically illustrating an example of a multilayer piezoelectric actuator which is an embodiment of a piezoelectric ceramic electronic component according to the present invention.
Figure 2:
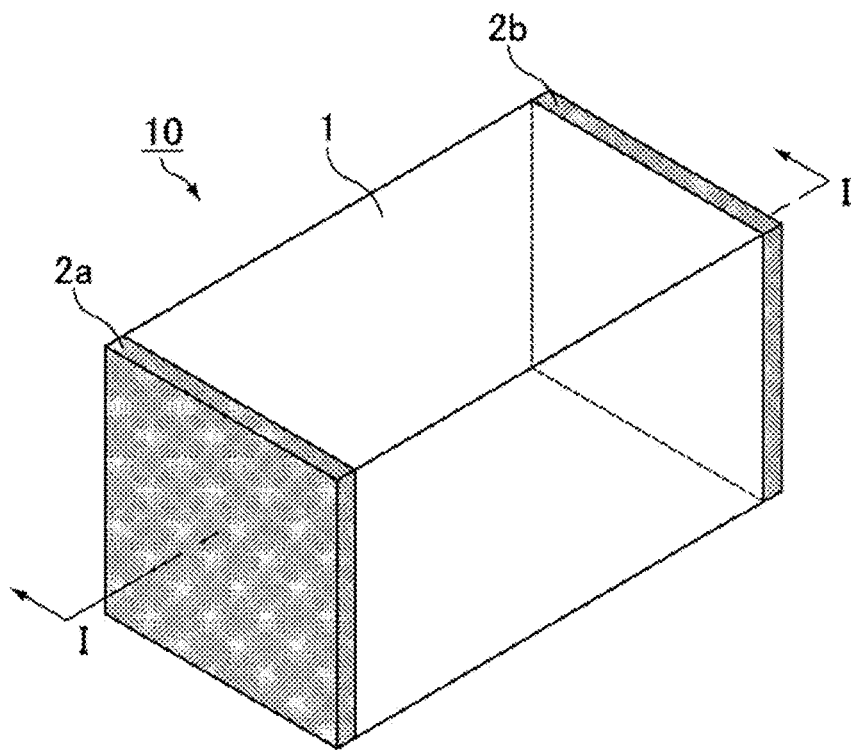
FIG. 2 is a perspective view of the multilayer piezoelectric actuator which is an embodiment of the piezoelectric ceramic electronic component according to the present invention.

FIG. 1 is a sectional view schematically illustrating an example of a multilayer piezoelectric actuator which is an embodiment of a piezoelectric ceramic electronic component according to the present invention. FIG. 2 is a perspective view of the multilayer piezoelectric actuator which is an embodiment of the piezoelectric ceramic electronic component according to the present invention. FIG. 1 corresponds to a sectional view taken along line I-I of the multilayer piezoelectric actuator illustrated in FIG. 2.

A multilayer piezoelectric actuator 10 illustrated in FIG. 1 and FIG. 2 includes a piezoelectric ceramic body 1 including piezoelectric ceramic layers 3a, 3b, 3c, 3d, 3e, 3f, 3g, and 3h, external electrodes 2a and 2b provided on the surface of the piezoelectric ceramic body 1, and internal electrodes 4a, 4b, 4c, 4d, 4e, 4f, and 4g provided inside the piezoelectric ceramic body 1. In FIG. 1 and FIG. 2, the external electrodes 2a and 2b are provided at both ends of the piezoelectric ceramic body 1. The external electrodes 2a and 2b are made of, for example, a conductive material such as Ag.

As illustrated in FIG. 1, in the piezoelectric ceramic body 1, piezoelectric ceramic layers 3a, 3b, 3c, 3d, 3e, 3f, 3g, and 3h and internal electrodes 4a, 4b, 4c, 4d, 4e, 4f, and 4g are alternately stacked. The piezoelectric ceramic layers 3a, 3b, 3c, 3d, 3e, 3f, 3g, and 3h are formed of a ceramic sintered body described later. The internal electrodes 4a, 4b, 4c, 4d, 4e, 4f, and 4g are formed of, for example, a conductive material containing Ni as a main component.

In the multilayer piezoelectric actuator 10, one end of the internal electrodes 4a, 4c, 4e, and 4g are electrically connected to one external electrode 2a, and one end of the internal electrodes 4b, 4d, and 4f are electrically connected to the other external electrode 2b. When a voltage is applied between the external electrode 2a and the external electrode 2b, the external electrode 2a is displaced in a stacking direction indicated by an arrow Z due to a piezoelectric vertical effect.

In the piezoelectric ceramic electronic component according to the present invention, the piezoelectric ceramic layer is formed of a ceramic sintered body containing a potassium sodium niobate (KNN)-based compound and Mn.

The KNN-based compound is a main component of the ceramic sintered body.

In the present specification, the "main component" means a component having the largest abundance ratio (mol %) in the ceramic sintered body, and desirably means a component having an abundance ratio exceeding 50 mol %.

The KNN-based compound has a perovskite-type structure and is represented by general formula $(K,Na)NbO_3$. The composition of the KNN-based compound is not particularly limited. The KNN-based compound preferably contains K as an alkali metal element, and more preferably contains at least one of Na and Li in addition to K. In addition, the KNN-based compound may contain other elements in addition to the above-described alkali metal element, and for example, may contain Ta.

The ceramic sintered body preferably contains the KNN-based compound in an amount of more than 50 mol %, more preferably 90 mol % or more. On the other hand, the ceramic sintered body preferably contains the KNN-based compound in an amount of 99 mol % or less, and may contain the KNN-based compound in an amount of 85 mol % or less.

Mn is an accessory component of the ceramic sintered body. As described above, Mn has a role of forming an electrical pair with an oxygen defect, hindering movement of the oxygen defect, and suppressing a decrease in insulation resistance.

The ceramic sintered body preferably contains Mn in an amount of 2 mol % or more. Mn prevents the movement of oxygen defects and suppresses the decrease in the insulation resistance, but when the amount of Mn added is large, a heterogeneous phase containing Mn is formed in the ceramic sintered body. Since this different phase does not exhibit piezoelectricity, when the number of heterogeneous phases is large, the piezoelectricity of the entire ceramic sintered body is reduced. Therefore, the ceramic sintered body preferably contains Mn in an amount of 15 mol % or less, and more preferably 5 mol % or less.

The ceramic sintered body may contain other components for the purpose of, for example, improving piezoelectric characteristics. For example, the ceramic sintered body may contain a compound represented by general formula $M2M4O_3$ (where M2 represents at least one divalent element selected from the group consisting of Ba, Ca, and Sr, and M4 represents at least one tetravalent element selected from the group consisting of Zr, Sn, and Hf) in an appropriate amount in addition to the KNN-based compound. This makes it possible to further improve the piezoelectric characteristics. In addition, the ceramic sintered body may contain elements other than Mn as accessory components.

The ceramic sintered body is formed of a plurality of crystallites. A particle size of the crystallite is preferably 10 μm or less. On the other hand, the particle size of the crystallite is, for example, 0.1 μm or more.

The ceramic sintered body includes, for example, crystallites containing $(K_{1-a-b}Na_aLi_b)NbO_3$ ($0 \le a \le 0.9$, $0 \le b \le 0.1$) in an amount of 90 mol % or more and Mn in an amount of 2 mol % to 15 mol %, and having a particle size of 10 μm or less.

In the piezoelectric ceramic electronic component according to the present invention, when the piezoelectric ceramic layer sandwiched between adjacent electrodes is divided into three equal parts in the thickness direction to sequentially define a first region, a second region, and a third region between the adjacent electrodes, a second Mn concentration in the second region is higher than a first Mn concentration in the first region and a third Mn concentration in the third region.

As described above, by adding Mn to the KNN-based compound, the movement of oxygen defects in the piezoelectric ceramic layer can be prevented. However, since the amount of the KNN-based compound decreases as the amount of Mn added increases, the piezoelectric characteristics deteriorate. In the piezoelectric ceramic electronic component according to the present invention, the region having a high Mn concentration exists in the piezoelectric ceramic layer sandwiched between the adjacent electrodes, so that the movement of the oxygen defects in the piezoelectric ceramic layer can be prevented while maintaining high piezoelectric characteristics. In particular, since the region having a high Mn concentration exists in the vicinity of the center of the piezoelectric ceramic layer, it is possible to effectively prevent the movement of the oxygen defects and suppress a decrease in the insulation resistance without hindering application of an electric field to the piezoelectric ceramic layer. As a result, the insulation resistance life span during DC driving can be lengthened.

In the piezoelectric ceramic electronic component according to the present invention, the piezoelectric ceramic layer sandwiched between the adjacent electrodes is, for example, a piezoelectric ceramic layer sandwiched between a set of internal electrodes adjacent in the thickness direction. The piezoelectric ceramic layer sandwiched between the adjacent electrodes may be a piezoelectric ceramic layer sandwiched between a set of internal electrodes and external electrodes adjacent in the thickness direction. Alternatively, the piezoelectric ceramic layer sandwiched between the adjacent electrodes may be a piezoelectric ceramic layer sandwiched between a set of external electrodes adjacent in the thickness direction.

In the present specification, the "piezoelectric ceramic layer sandwiched between a set of internal electrodes adjacent in the thickness direction" means a piezoelectric ceramic layer sandwiched between a pair of internal electrodes (hereinafter, referred to as a counter electrode) having the smallest electrode interval among pairs of internal electrodes connected to different external electrodes in the piezoelectric ceramic body.

Figure 3:
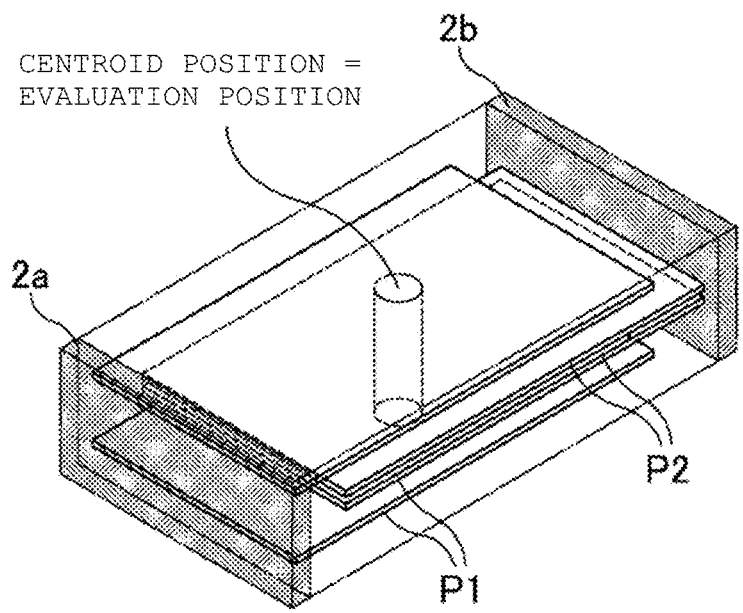
FIG. 3 is a first schematic view for explaining a position for evaluating a Mn concentration in a piezoelectric ceramic layer.

FIG. 3 is a first schematic view for explaining a position for evaluating a Mn concentration in a piezoelectric ceramic layer.

As illustrated in FIG. 3, when the external electrodes 2a and 2b are provided at both ends of the piezoelectric ceramic body, the Mn concentration in the piezoelectric ceramic layer sandwiched between a pair $P_1$ of internal electrodes having the smallest electrode interval among a pair of internal electrodes connected to the external electrode 2a and a pair of internal electrodes connected to the external electrode 2b is evaluated. Specifically, it is desirable to evaluate the Mn concentration at a centroid position of the piezoelectric ceramic body when viewed from a plane parallel to the internal electrode. On the other hand, the Mn concentration in the piezoelectric ceramic layer sandwiched between a pair $P_2$ of internal electrodes connected to the same external electrodes $2a$ or $2b$ is not subject to the evaluation.

Figure 4:
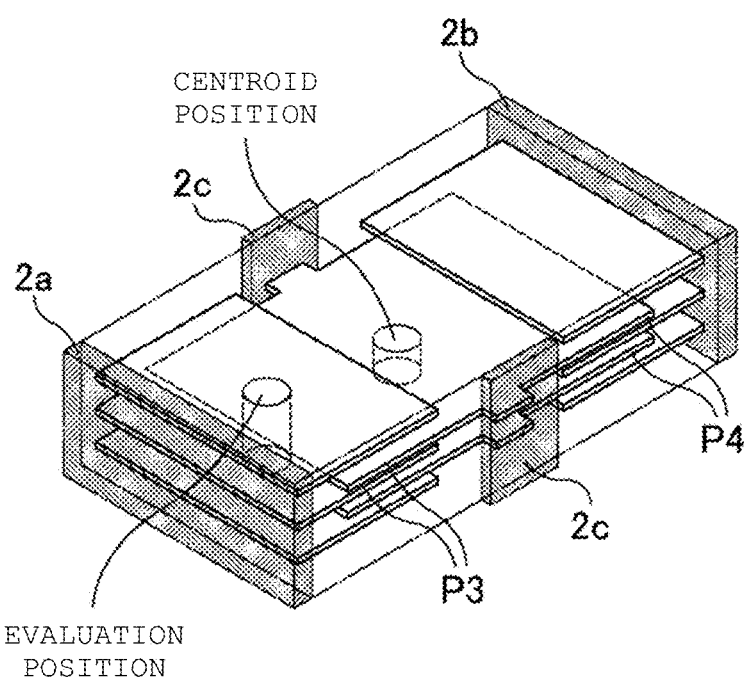
FIG. 4 is a second schematic view for explaining a position for evaluating a Mn concentration in a piezoelectric ceramic layer.

FIG. 4 is a second schematic view for explaining a position for evaluating a Mn concentration in a piezoelectric ceramic layer.

In FIG. 4, the external electrodes $2a$ and $2b$ are provided at both ends of the piezoelectric ceramic body, and the external electrodes $2c$ are provided at both sides of the piezoelectric ceramic body. In FIG. 4, the Mn concentration in the piezoelectric ceramic layer sandwiched between a pair $P_3$ of internal electrodes having the smallest electrode interval among the pair of internal electrodes connected to the external electrode $2a$ or $2b$ and the pair of internal electrodes connected to the external electrode $2c$ is evaluated. As illustrated in FIG. 4, when the pair of internal electrodes having the smallest electrode interval does not face each other at the centroid position of the piezoelectric ceramic body, or when the electrode interval does not become the smallest at the centroid position of the piezoelectric ceramic body, the Mn concentration may be evaluated by selecting the position where the interval of the internal electrodes becomes the smallest among the regions where the internal electrodes face each other. Similarly to FIG. 3, the Mn concentration in the piezoelectric ceramic layer sandwiched between a pair $P_4$ of internal electrodes connected to the same external electrode $2a$, $2b$, or $2c$ is not subject to the evaluation.

The distribution of the Mn concentration in each region of the piezoelectric ceramic layer is determined by WDX (wavelength dispersive fluorescent X-ray) as follows. Further, the distribution of the Mn concentration in each region of the piezoelectric ceramic layer can also be determined by Dynamic SIMS (D-SIMS) described later.

First, the piezoelectric ceramic electronic component is embedded in a resin such as a urethane resin, and polished from the side surface in the stacking direction to expose a cross section. In the obtained cross section, the field of view is adjusted using WDX so that the counter electrode described above has a magnification within one field of view and the counter electrode is substantially parallel to the vertical axis of the field of view, and element mapping analysis using a metal element, for example, Ni, which is a main component of the internal electrode, as a target element is performed. Separately, elemental mapping analysis using Mn as a target element is performed. As for the width of the field of view, the length of one side of the field of view is desirably 10 times or more, and more desirably 20 times or more the average particle diameter of the ceramic sintered body. This is because a heterogeneous phase is likely to occur in the KNN-based compound, and the distribution state of elements cannot be correctly grasped when the number of particles included in one field of view is small.

Figure 5A:
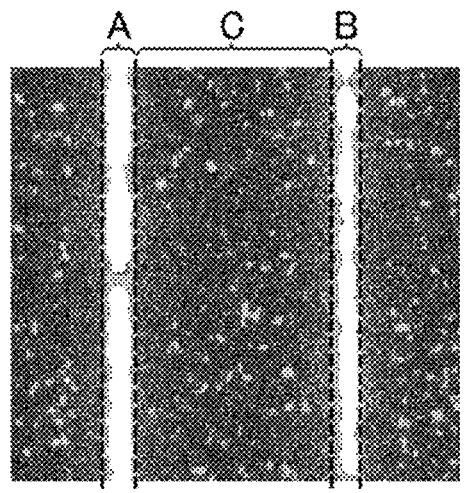
FIG. 5(A) is an example of a mapping image of a Ni element.
Figure 5B:
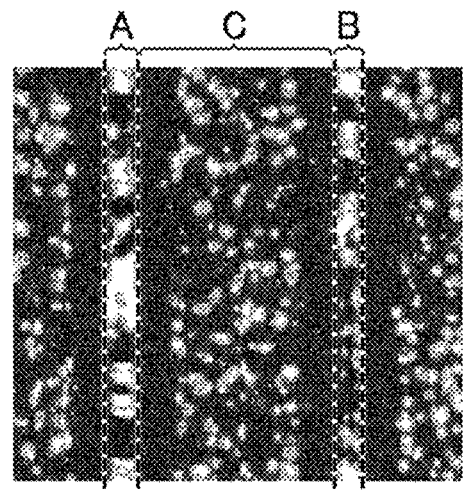
FIG. 5(B) is an example of a mapping image of a Mn element.

FIG. 5(A) is an example of a mapping image of a Ni element, and FIG. 5(B) is an example of a mapping image of a Mn element.

From the mapping image of the Ni element illustrated in FIG. 5(A), it can be found that regions where Ni exists are an internal electrode A and an internal electrode B, and a region sandwiched between the internal electrode A and the internal electrode B is a piezoelectric ceramic layer C. On the other hand, from the mapping image of the Mn element illustrated in FIG. 5(B), it can be found that a region having a high Mn concentration exists near the center of the piezoelectric ceramic layer C, and Mn also exists in the internal electrode A and the internal electrode B.

FIG. 6(A), FIG. 6(B), FIG. 6(C), and FIG. 6(D) are schematic views for explaining a procedure of dividing the piezoelectric ceramic layer into a first region, a second region, and a third region.

Figure 6A:
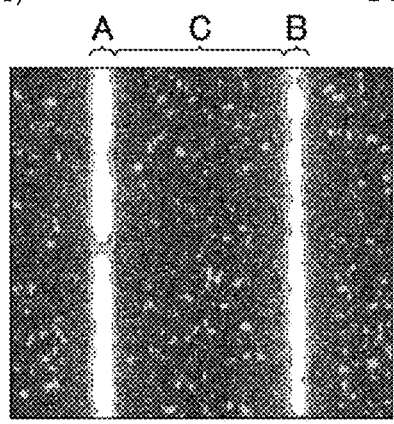
FIG. 6(A), FIG. 6(B), FIG. 6(C), and FIG. 6(D) are schematic views for explaining a procedure of dividing a piezoelectric ceramic layer into a first region, a second region, and a third region.

A peak value of the detection amount of the metal element in the field of view is read from detection count information obtained from the mapping image of the metal element which is the main component of the internal electrode illustrated in FIG. 6(A). A portion where the detection amount of ½ or more of the peak value of the detection amount is obtained is identified as an electrode portion, and a portion where the detection amount of less than ½ is obtained is identified as a ceramic portion.

For an interface between the internal electrode A and the piezoelectric ceramic layer C and an interface between the internal electrode B and the piezoelectric ceramic layer C illustrated in FIG. 6(A), boundary lines are defined as follows.

Figure 6B:
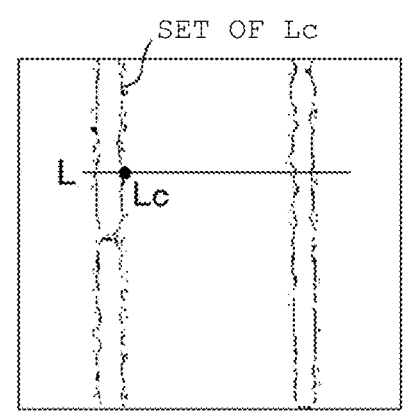

As illustrated in FIG. 6(B), first, a straight line L parallel to a longitudinal direction (a lateral direction in FIG. 6(B)) of the field of view from the electrode A toward the electrode B is considered. Assuming that the interface between the internal electrode A and the piezoelectric ceramic layer C on the straight line L is Lc, a curve that becomes a set of Lc is obtained in a range from the left end of the field of view to the right end of the field of view (from the upper end to the lower end in FIG. 6(B). In a case where there is no interface between the internal electrode A and the piezoelectric ceramic layer C on the straight line L that is away from the left end of the field of view to some extent, Lc may be interrupted.

Figure 6C:
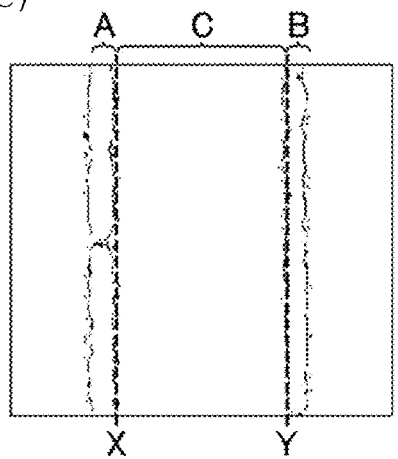

Next, as illustrated in FIG. 6(C), a straight line that minimizes the sum of squares of the distances in the longitudinal direction of the field of view from Lc is drawn for a curve that is a set of Lc. This straight line is defined as a boundary line X of the interface between the internal electrode A and the piezoelectric ceramic layer C. Similarly, a boundary line Y is set for the interface between the internal electrode B and the piezoelectric ceramic layer C.

Figure 6D:
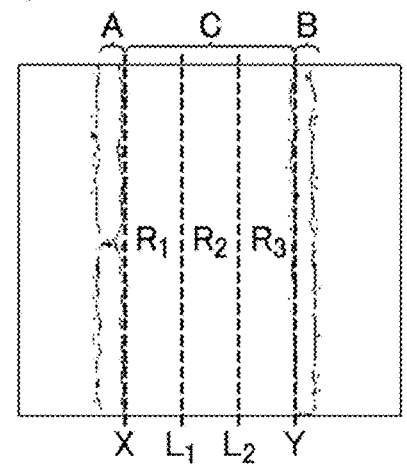

As illustrated in FIG. 6(D), straight lines $L_1$ and $L_2$ dividing the boundary line X to the boundary line Y into three equal parts are drawn. In order from the internal electrode A side to the internal electrode B side, a region between the boundary line X and the straight line $L_1$ is defined as a first region $R_1$, a region between the straight line $L_1$ and the straight line $L_2$ is defined as a second region $R_2$, and a region between the straight line $L_2$ and the boundary line Y is defined as a third region $R_3$.

The Mn concentration is calculated for each region. The Mn concentration is calculated by quantifying the detection amount of fluorescent X-rays in each pixel of the mapping analysis result and calculating an average value for each region.

When a first Mn concentration in the first region is defined as $c_{m1}$, a second Mn concentration in the second region is defined as $c_{m2}$, and a third Mn concentration in the third region is defined as $c_{m3}$, a value of $c_{m2}/c_{m1}$ and a value of $c_{m2}/c_{m3}$ may be the same as or different from each other. Each of the value of $c_{m2}/c_{m1}$ and the value of $c_{m2}/c_{m3}$ is preferably larger than 1.0, and more preferably 1.2 or more. On the other hand, the value of $c_{m2}/c_{m1}$ and the value of $c_{m2}/c_{m3}$ are each preferably 2.0 or less, and more preferably 1.7 or less.

In the piezoelectric ceramic electronic component according to the present invention, as illustrated in FIG. 5(B), it is preferable that the piezoelectric ceramic layer sandwiched between the adjacent electrodes is formed of a first Mn low-concentration layer, a Mn high-concentration layer, and a second Mn low-concentration layer in order from one electrode side to the other electrode side, and a Mn concentration in the Mn high-concentration layer is higher than a Mn concentration in the first Mn low-concentration layer and a Mn concentration in the second Mn low-concentration layer. That is, in the piezoelectric ceramic layer sandwiched between the adjacent electrodes, a layer having a high Mn concentration is preferably sandwiched between layers having a low Mn concentration in the thickness direction thereof. This reliably prevents the movement of oxygen defects.

As illustrated in FIG. 5(B), the Mn high-concentration layer is preferably thicker than the first Mn low-concentration layer and the second Mn low-concentration layer. The thickness of the first Mn low-concentration layer may be the same as or different from the thickness of the second Mn low-concentration layer.

In the piezoelectric ceramic electronic component according to the present invention, the piezoelectric ceramic layer sandwiched between the adjacent electrodes preferably contains Li. When Li is contained in the piezoelectric ceramic layer, the sinterability in a reducing atmosphere is improved, and the Mn concentration tends to be distributed in layers in the piezoelectric ceramic layer. As a result, the insulation resistance life at the time of DC driving can be further extended.

From the viewpoint of improving the sinterability, a Li concentration in the piezoelectric ceramic layer sandwiched between the adjacent electrodes is preferably 0.03 wt % or more. On the other hand, when the Li concentration increases, Li reacts with Mn to easily form $Li_xMn_2O_4$ (lithium manganate), and thus it is considered that the effect of preventing the movement of oxygen defects by Mn is hardly obtained. Therefore, a Li concentration in the piezoelectric ceramic layer sandwiched between the adjacent electrodes is preferably 0.06 wt % or lower.

The piezoelectric ceramic layer sandwiched between the adjacent electrodes preferably has a segregation region where the Mn/Li concentration ratio is 4 or more in terms of molar ratio. In the segregation region, since the Li concentration is lower than the Mn concentration, it is considered that the above-described lithium manganate is hardly formed, and the effect of preventing the movement of oxygen defects by Mn is sufficiently obtained.

In the segregation region, the upper limit of the Mn/Li concentration ratio is not particularly limited, but for example, the Mn/Li concentration ratio is 15.0 or less in terms of molar ratio.

The thickness of the segregation region where the Mn/Li concentration ratio is 4 or more in terms of molar ratio is preferably 0.50 times or more, more preferably 0.55 times or more the thickness of the piezoelectric ceramic layer where the segregation region exists. On the other hand, the thickness of the segregation region where the Mn/Li concentration ratio is 4 or more in terms of molar ratio is 1 time or less, preferably 0.90 times or less, more preferably 0.80 times or less, and still more preferably 0.70 times or less the thickness of the piezoelectric ceramic layer where the segregation region exists.

Here, the existence of the segregation region is defined as follows. The piezoelectric ceramic body is cut and polished into a cross section parallel to the thickness direction and the long side direction, and observed with a scanning electron microscope (SEM) or the like in a field of view in which the piezoelectric ceramic layer and a plurality of internal electrodes or external electrodes are included and the internal electrodes are substantially parallel to the vertical or horizontal axis of the field of view on this surface. In this field of view, an average thickness of a piezoelectric ceramic layer that is sandwiched between a set of internal electrodes or a set of external electrodes or a set of an internal electrode and an external electrode and that does not include an electrode therein is defined as t μm. Next, in a square or rectangular range of 0.5 t to 2 t μm in both vertical and horizontal directions, Mn and Li, and an element that is contained in a large amount in the electrode and is hardly contained in the ceramic portion, for example, Ni, are subjected to mapping analysis of element distribution using D-SIMS, TOF-SIMS, WDX, or the like at a resolution of 200 pixels or more on each of vertical and horizontal sides. Regarding the obtained element distribution data, first, with respect to an element contained in a large amount in the electrode and hardly contained in the ceramic portion, an average value of detection values in each pixel in the field of view is used as a threshold, and a region lower than this value is determined as a ceramic portion. Subsequently, regarding Mn and Li in this field of view, the average amount of Mn and Li in a rectangular region, which is 1 μm in a direction substantially perpendicular to the electrode portion from one end to the other end of the field of view in a direction substantially parallel to the electrode portion, is measured as a molar amount, and a region where the concentration ratio of Mn/Li is 4 or more in terms of a molar ratio is defined as a segregation region.

The distribution of the Li concentration and the Mn concentration in the piezoelectric ceramic layer is determined, for example, by D-SIMS as follows.

Figure 7A:
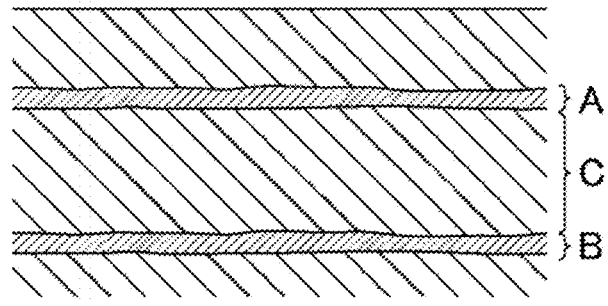
FIG. 7(A), FIG. 7(B), and FIG. 7(C) are schematic diagrams for explaining a procedure of D-SIMS analysis.
Figure 7B:
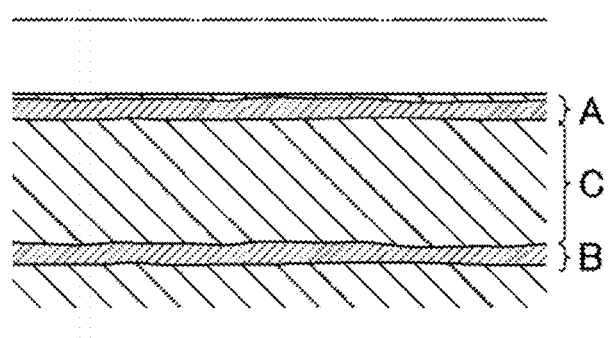
Figure 7C:
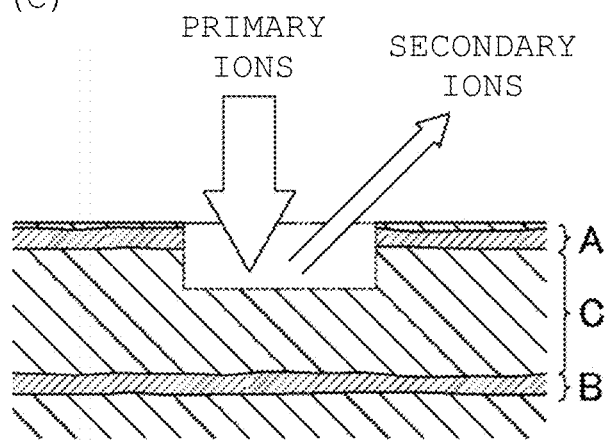

FIG. 7(A), FIG. 7(B), and FIG. 7(C) are schematic diagrams for explaining a procedure of D-SIMS analysis. FIG. 7(A), FIG. 7(B), and FIG. 7(C) illustrate schematic views, which are different from the actual size of a sputtering region.

As illustrated in FIG. 7(B), the sample illustrated in FIG. 7(A) is polished to the position of the internal electrode A in front of the piezoelectric ceramic layer C to be measured. As illustrated in FIG. 7(C), while a sample is excavated by ion sputtering using primary ions ($O_2^+$ ions and the like) by D-SIMS, secondary ions ($Li^+$ ions, $Mn_2^+$ ions, and the like) ejected from the element at that time are detected by a mass analyzer. Thus, the amount of the contained element with respect to the processing depth of the ion sputtering is analyzed. The size of the sputtering region is 60 μm square, and the secondary ion detection target range is 12 μm square. When the distance between the internal electrodes is long (for example, 15 μm or more) and it is difficult to perform excavation only by ion sputtering, the element may be divided into a plurality of pieces, polished in parallel to the internal electrodes, D-SIMS analysis may be performed from the polishing position, and analysis results may be connected in consideration of the polishing amount.

(Identification of Electrode Portion and Ceramic Portion)

Regarding the amount of Ni detected by D-SIMS, a portion up to ½ of the peak value of the detection amount is identified as an electrode portion, and a portion less than ½ is identified as a ceramic portion.

(Calculation of Amount of Li and Amount of Mn Contained in Ceramic Portion)

A ceramic sample for comparison in which the amount of Mn and the amount of Li are known is simultaneously analyzed, a calibration curve is created from the detection amount in D-SIMS, and the detection amount is calibrated from the measured value. The ceramic sample for comparison is preferably a sintered body containing KNN as a main component and containing Mn and Li, and has a uniform composition distribution. As the ceramic sample for comparison, for example, a sintered body which is $(K_{0.45}Na_{0.50}Li_{0.05})(Nb_{0.95}Mn_{0.05})O_3$ and does not include an internal electrode is prepared, and the absolute value of the composition is evaluated in advance by ICP or the like. In addition, it is desirable to confirm that the composition distribution inside the ceramic sample for comparison is sufficiently small by analyzing the composition distribution by D-SIMS or by dividing the ceramic sample into small pieces and analyzing the composition distribution by ICP or the like.

For the ceramic sample for comparison, the Mn concentration and the Li concentration are measured by D-SIMS with the size of the sputtering region being 60 μm square and the secondary ion detection target range being 12 μm square, and the values are defined as a. On the other hand, a ceramic sample for comparison prepared under the same conditions is sufficiently dissolved in nitric acid heated to 40° C. or higher and having a concentration of 1N or more, analyzed by ICP or the like, and the value is defined as b. When the composition distribution in the ceramic sample to be analyzed is calculated, the absolute amount of the composition is calculated from the detection value in D-SIMS by multiplying the detection value x in D-SIMS by b/a.

(Calculation of Proportion of Segregation Region Where Mn/Li Concentration Ratio is 4 or More in Terms of Molar Ratio)

The respective molar amounts are calculated from the Mn amount and the Li amount obtained by the above method, and the molar ratio of Mn and Li is calculated from the obtained molar amount. The region where the molar ratio is 4 or more is defined as a segregation region, and the ratio of the thickness of the segregation region to the thickness of the piezoelectric ceramic layer where the segregation region exists is calculated.

[Method for Manufacturing Piezoelectric Ceramic Electronic Component]

Hereinafter, an example of a method for manufacturing the multilayer piezoelectric actuator 10 illustrated in FIG. 1 and FIG. 2 will be described as an embodiment of a method for manufacturing a piezoelectric ceramic electronic component according to the present invention.

First, as ceramic raw materials, for example, a K compound containing K, a Nb compound containing Nb, and a Mn compound containing divalent Mn are prepared. As necessary, a Na compound containing Na, a Li compound containing Li, and the like are prepared. The form of the compound may be any of an oxide, a carbonate, and a hydroxide.

Next, predetermined amounts of the ceramic raw materials are weighed, and then these weighed materials are put into a ball mill containing a grinding medium such as PSZ balls, and subjected to sufficient wet grinding under a solvent such as ethanol to obtain a mixture.

The resulting mixture is dried and then calcined at a predetermined temperature (for example, 800° C. or higher and 1000° C. or lower) to synthesize a calcined product.

The resulting calcined product is crushed, an organic binder and a dispersant are then added, and wet-mixed in a ball mill using pure water or the like as a solvent to obtain a ceramic slurry. Thereafter, a ceramic green sheet is prepared by performing molding processing using a doctor blade method or the like.

Next, using a conductive paste for an internal electrode containing a conductive material such as Ni as a main component, a conductive layer having a predetermined shape is formed on the ceramic green sheet by screen printing.

Figure 8:
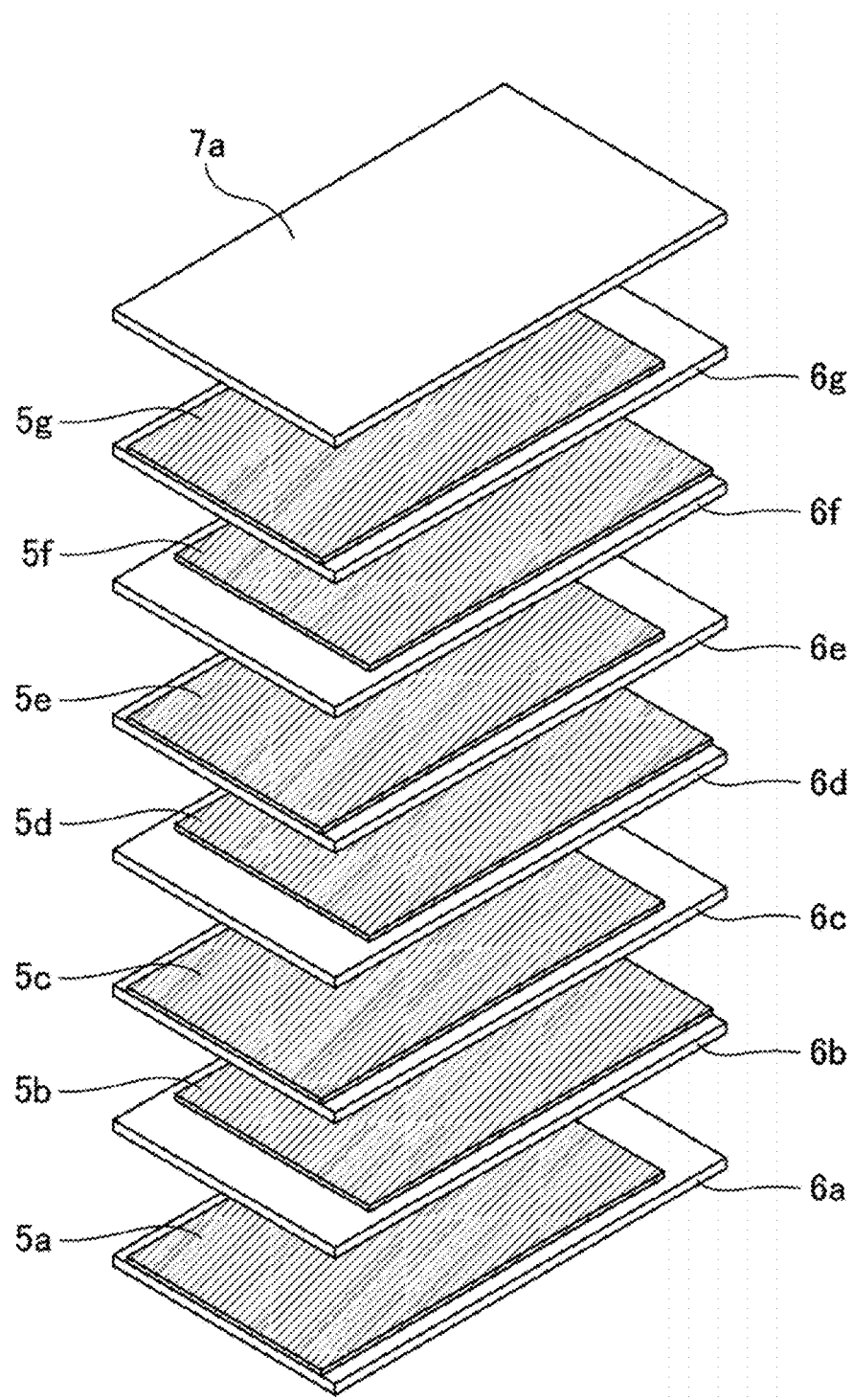
FIG. 8 is a perspective view schematically illustrating a ceramic green sheet obtained in a process of manufacturing the multilayer piezoelectric actuator.

FIG. 8 is a perspective view schematically illustrating a ceramic green sheet obtained in a process of manufacturing the multilayer piezoelectric actuator.

As illustrated in FIG. 8, ceramic green sheets 6a, 6b, 6c, 6d, 6e, 6f, and 6g on which conductive layers 5a, 5b, 5c, 5d, 5e, 5f, and 5g are formed, respectively, are stacked, and then sandwiched and pressure-bonded by a ceramic green sheet 7a on which no conductive layer is formed. With this, a ceramic laminate in which the ceramic green sheets 6a, 6b, 6c, 6d, 6e, 6f, and 6g and the conductive layers 5a, 5b, 5c, 5d, 5e, 5f, and 5g are alternately stacked is prepared.

The obtained ceramic laminate is cut into a predetermined size, placed on a firing jig made of alumina, subjected to a binder removal treatment at a predetermined temperature (for example, 250° C. or higher and 500° C. or lower), and then fired at a predetermined temperature (for example, 1000° C. or higher and 1160° C. or lower) in a reducing atmosphere to form a piezoelectric ceramic body 1 in which the internal electrodes 4a, 4b, 4c, 4d, 4e, 4f, and 4g are embedded.

In order to co-fire a conductive layer containing Ni as a main component and a ceramic green sheet containing a KNN-based compound as a main component, it is necessary to fire in a reducing atmosphere. Since the Mn concentration has a layered distribution in the piezoelectric ceramic layer, it is important to allow a sufficient reducing atmosphere gas to flow into the internal volume of the firing furnace and to allow a body to be fired to sufficiently come into contact with the atmosphere gas. Therefore, it is preferable to perform firing by placing a spacer under the body to be fired. In addition, it is preferable to introduce a gas of 0.1 a (L/min) or more with respect to the internal volume a (L) of the firing furnace. An oxygen partial pressure of the gas is preferably maintained at an equilibrium oxygen partial pressure of Ni and NiO or a value lower than the equilibrium oxygen partial pressure so that Ni is not oxidized.

Li is preferably added in order to improve the sinterability, but on the other hand, it is necessary to reduce the Li concentration in the piezoelectric ceramic layer in order to form the segregation region described above. Examples of the method for adjusting the Li concentration include a method for adjusting the amount of the ceramic raw material to be charged when the ceramic raw material is mixed, and a method for adjusting the amount of Li remaining by adjusting the flow conditions of the reducing atmosphere gas.

Next, a conductive paste for an external electrode made of a conductive material such as Ag is applied to both ends of the piezoelectric ceramic body 1, and baked at a predetermined temperature (for example, 750° C. or higher and 850° C. or lower) to form the external electrodes 2a and 2b.

Thereafter, the multilayer piezoelectric actuator 10 is manufactured by performing predetermined polarization processing. The external electrodes 2a and 2b only need to have good adhesion with the piezoelectric ceramic body 1, and may be formed by a thin film forming method such as a sputtering method or a vacuum vapor deposition method.

Examples

Hereinafter, examples that more specifically disclose the piezoelectric ceramic electronic component according to the present invention will be described. Note that the present invention is not limited only to these Examples.

(Sample 1)

As ceramic raw materials, potassium carbonate $K_2CO_3$, sodium carbonate $Na_2CO_3$, lithium carbonate $Li_2CO_3$, niobium oxide $Nb_2O_5$, and manganese carbonate $MnCO_3$ were prepared. Then, the ceramic raw material was weighed so as to be $(K_{1-a-b}Na_aLi_b)NbO_3$ ($0 \leq a \leq 0.9$, $0 \leq b \leq 0.1$). Specifically, $K_2CO_3$: 15.03 wt %, $Na_2CO_3$: 13.68 wt %, $Li_2CO_3$: 1.12 wt %, $Nb_2O_5$: 67.26 wt %, and $MnCO_3$: 2.91 wt % were set. The weighed materials were put into a ball mill, and mixed and stirred with ethanol as a solvent to obtain a slurry. The obtained slurry was dried and then calcined at 900° C. to obtain a calcined powder.

The calcined powder was dispersed in an organic solvent containing a binder, a dispersant, a surfactant, and ethanol as main components to obtain a slurry containing a calcined raw material. The obtained slurry containing a calcined raw material was applied onto a carrier film and dried to prepare a ceramic green sheet containing a calcined raw material.

A ceramic green sheet was cut, and a conductive layer was printed using a conductive paste for an internal electrode containing Ni as a main component, and then stacked and pressure-bonded to prepare a multilayer pressure-bonded body.

The multilayer pressure-bonded body was cut, and then placed on a firing jig made of alumina for degreasing. Thereafter, firing was performed while controlling the oxygen partial pressure to prepare a multilayer sintered body including an internal electrode mainly formed of Ni. The oxygen partial pressure was controlled so as to be lower than the equilibrium oxygen partial pressure of Ni and NiO at each temperature during the firing. The firing temperature was set to 1100° C. In the present example, the firing was performed by introducing a reducing mixed gas of 0.1 a (L/min) or more into the internal volume a (L) of the firing furnace. A spacer was placed under the body to be fired so that a sufficient reducing atmosphere gas was allowed to flow into the internal volume of the firing furnace and the body to be fired was sufficiently exposed to the atmosphere gas, and firing was performed.

(Samples 2 to 4)

A multilayer pressure-bonded body was prepared in the same manner as in Sample 1. In Sample 2, a multilayer sintered body was prepared under the same conditions as in Sample 1 except that the charged amount of Li was changed to 0.25 times as large as that in Sample 1. A multilayer sintered body was prepared under the same conditions as in Sample 2 except that the flow rate of the atmosphere gas of Sample 2 was changed to 1.2 times in Sample 3 and the flow rate of the atmosphere gas of Sample 2 was changed to 1.4 times in Sample 4.

(Sample 5)

A multilayer sintered body was prepared by the same method as in Sample 1 except that Li was removed from the charged composition of the ceramic raw materials.

(Sample 6)

A multilayer pressure-bonded body was prepared in the same manner as in Sample 1. After degreasing the multilayer pressure-bonded body, the gas flow rate was changed so as to be less than 0.1 a (L/min) with respect to the internal volume a (L) of the firing furnace, and a multilayer sintered body was prepared under the same conditions as Sample 1 except for this. The oxygen partial pressure was controlled so as to be lower than the equilibrium oxygen partial pressure of Ni and NiO.

(Analysis of Distribution of Mn Concentration by WDX)

For Samples 1 to 6, the distribution of Mn concentration was determined by WDX according to the method described above. An element mapping image was obtained by performing analysis using Ni and Mn as target elements to be analyzed. The measurement conditions of WDX are indicated in Table 1. The angle of the sample was adjusted so that the internal electrode adjacent to the piezoelectric ceramic layer to be observed was substantially parallel to the lateral side of the square WDX observation field of view.

TABLE 1

| FE-WDX measurement conditions | |
| --- | --- |
| Measurement device | JXA-8500F manufactured by JEOL Ltd. |
| Acceleration voltage | 15.0 kV |
| Irradiation current | $5 \times 10^{-8}$ A |
| Dwell Time | 40 ms |

(Analysis of Distribution of Li Concentration and Mn Concentration by D-SIMS)

For Samples 1 to 6, distributions of Li concentration and Mn concentration were determined by D-SIMS according to the method described above. The D-SIMS analysis was performed by dividing each sample into a plurality of pieces. Measurement conditions of D-SIMS are indicated in Table 2.

TABLE 2

| D-SIMS measurement conditions | | |
| --- | --- | --- |
| | Electrode portion | Ceramic portion |
| Measurement device | PHI ADEPT1010 | |
| Kinds of primary ions | $O_2^+$ | |
| Primary acceleration voltage | 6.0 kV | |
| Sputtering region | 60 μm × 60 μm | |
| Detection region | 12 μm × 12 μm from center of sputtering region | |
| Target element to be analyzed | Li, Mn | Li, Mn |
| Monitoring element | O, Nb | Ni, Nb |
| Standard sample *Composition is evaluated in advance by ICP | Metal Ni | KNN sintered body |

FIG. 9(A), FIG. 9(B), FIG. 9(C), FIG. 9(D), and FIG. 9(E) illustrate the analysis results of the Mn concentration and the Li concentration of Sample 6. FIG. 9(A) is a Ni mapping image, FIG. 9(B) is a Mn mapping image, FIG. 9(C) is a Li mapping image, FIG. 9(D) is a graph illustrating a distribution of a Mn concentration, and FIG. 9(E) is a graph illustrating a distribution of a Li concentration.

FIG. 10(A), FIG. 10(B), FIG. 10(C), FIG. 10(D), and FIG. 10(E) illustrate the analysis results of the Mn concentration and the Li concentration of Sample 3. FIG. 10(A) is a Ni mapping image, FIG. 10(B) is a Mn mapping image, FIG. 10(C) is a Li mapping image, FIG. 10(D) is a graph illustrating a distribution of a Mn concentration, and FIG. 10(E) is a graph illustrating a distribution of a Li concentration.

FIG. 9(A) to FIG. 9(E) and FIG. 10(A) to FIG. 10(E) illustrate results up to 15 μm, which is a depth at which accurate D-SIMS analysis can be performed. The position of the analysis depth of 15 μm corresponds to the second region of the piezoelectric ceramic layer, and is specifically between the straight line $L_1$ and the straight line $L_2$ illustrated in FIG. 6(D).

Figure 11:
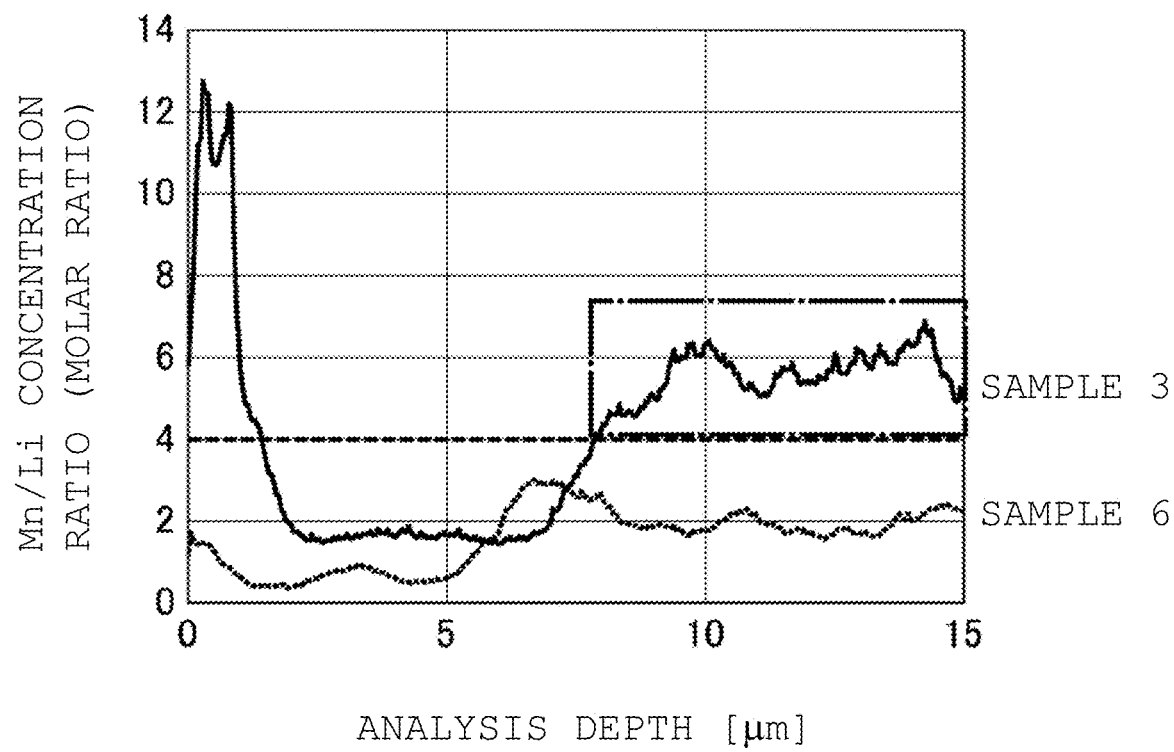
FIG. 11 is a graph illustrating distributions of Mn/Li concentration ratios in Sample 3 and Sample 6.

FIG. 11 is a graph illustrating distributions of Mn/Li concentration ratios in Sample 3 and Sample 6.

From FIG. 11, it can be found that in sample 3, there is a segregation region where the Mn/Li concentration ratio is 4 or more in terms of molar ratio.

Regarding Samples 1 to 6, when a first Mn concentration in the first region of the piezoelectric ceramic layer is defined as $c_{m1}$, a second Mn concentration in the second region is defined as $c_{m2}$, and a third Mn concentration in the third region is defined as $c_{m3}$, a value of $c_{m2}/c_{m1}$ and a value of $c_{m2}/c_{m3}$ are indicated in Table 3. Table 3 further indicates the ratio of the thickness of the segregation region to the thickness of the piezoelectric ceramic layer when the Li concentration in the piezoelectric ceramic layer and the region where the molar ratio of Mn/Li concentration in the piezoelectric ceramic layer is 4 or more are regarded as the segregation region.

The Mn concentration and the Li concentration in each region were determined as follows. First, a weight fraction of Mn contained in the standard sample is measured by ICP, and this concentration is defined as $c_{standard}$. On the other hand, the average value of the detection values of Mn when the standard sample is measured by TOF-SIMS is defined as $I_{standard}$. When the detection value of Mn when the element to be target was measured by TOF-SIMS was defined as $I_{sample}$, the concentration $c_m$ of Mn in this region was determined as $c_m = c_{standard} \times I_{sample}/I_{standard}$.

Separately, for Samples 1 to 6, the insulation resistivity ρ (Ω·cm) was measured when a DC electric field of 3.8 kV/mm was applied at 100° C., and the time to be decreased up to log ρ≤5 was defined as a DC load life. Table 3 indicates relative values when the DC load life of Sample 6 is 1. Further, the density of Samples 1 to 6 is indicated in Table 3.

together with Mn during sintering, so that layered regions having different Mn concentrations are likely to be formed in the piezoelectric ceramic layer.

As described in Samples 2 to 4, when the Li concentration in the piezoelectric ceramic layer is 0.03 wt % to 0.06 wt %, the life at the time of DC driving is further prolonged. This is considered to be because much of Mn remains in the piezoelectric ceramic layer.

As described in Samples 3 and 4, when the ratio of the segregation region where the Mn/Li concentration ratio is 4 or more in terms of molar ratio is large, the life at the time of DC driving is significantly prolonged. When the ratio of the segregation region is large, it is considered that since the formation of a compound in which Li and Mn are stable is hindered, the amount of Mn solid-solved in the KNN-based compound can be increased.

On the other hand, Sample 6 has a short life during DC driving. This is considered to be because the Mn concentration does not form a layered structure in the piezoelectric ceramic layer, and the movement of oxygen defects cannot be sufficiently prevented.

DESCRIPTION OF REFERENCE SYMBOLS

1: Piezoelectric ceramic body
2a, 2b, 2c: External electrode
3a, 3b, 3c, 3d, 3e, 3f, 3g, 3h: Piezoelectric ceramic layer
4a, 4b, 4c, 4d, 4e, 4f, 4g: Internal electrode
5a, 5b, 5c, 5d, 5e, 5f, 5g: Conductive layer
6a, 6b, 6c, 6d, 6e, 6f, 6g, 7a: Ceramic green sheet
10: Multilayer piezoelectric actuator (piezoelectric ceramic electronic component)
A, B: Internal electrode
C: Piezoelectric ceramic layer

TABLE 3

| Sample No. | Piezoelectric ceramic layer | | Li concentration (wt %) | Ratio of thickness of segregation region to thickness of piezoelectric ceramic layer | DC load life (absolute value) | Density (g/cm³) |
|---|---|---|---|---|---|---|
| | Mn concentration | | | | | |
| | $C_{m2}/C_{m1}$ | $C_{m2}/C_{m3}$ | | | | |
| 1 | 1.7 | 1.7 | 0.16 | 0.10 | 560 | 4.56 |
| 2 | 1.6 | 1.5 | 0.04 | 0.36 | 750 | 4.64 |
| 3 | 1.5 | 1.4 | 0.03 | 0.55 | ≥2500 | 4.61 |
| 4 | 1.4 | 1.4 | 0.05 | 0.67 | ≥2500 | 4.62 |
| 5 | 1.2 | 1.2 | 0.00 | — | 185 | 4.43 |
| 6* | 0.93 | 0.97 | 0.20 | 0.00 | 1 | 4.53 |

In Table 3, the sample numbers marked with * are comparative examples outside the scope of the present invention.

As described in Samples 1 to 5, by providing a region having a high Mn concentration in the vicinity of the center of the piezoelectric ceramic layer, the life at the time of DC driving becomes longer than that of Sample 6. This is considered to be because the movement of oxygen defects can be prevented by the region having a high Mn concentration.

As described in Samples 1 to 4, when Li is contained in the piezoelectric ceramic layer, the sintering density is higher than that of Sample 5, and the life at the time of DC driving is prolonged. It is considered that when Li is contained in the piezoelectric ceramic layer, Li can move $P_1, P_2, P_3, P_4$: Pair of internal electrodes
$R_1$: First region
$R_2$: Second region
$R_3$: Third region

The invention claimed is:
1. A piezoelectric ceramic electronic component comprising:
   a piezoelectric ceramic body including at least one piezoelectric ceramic layer; and
   a plurality of electrodes on a surface of or inside the piezoelectric ceramic body and arranged so that the at least one piezoelectric ceramic layer is sandwiched between adjacent electrodes of the plurality of electrodes, wherein
the at least one piezoelectric ceramic layer is a ceramic sintered body containing a potassium sodium niobate-based compound and Mn, and
when the at least one piezoelectric ceramic layer sandwiched between the adjacent electrodes is divided into three equal parts in a thickness direction to sequentially define a first region, a second region, and a third region between the adjacent electrodes, a second Mn concentration in the second region is higher than a first Mn concentration in the first region and a third Mn concentration in the third region.

2. The piezoelectric ceramic electronic component according to claim 1, wherein the at least one piezoelectric ceramic layer sandwiched between the adjacent electrodes contains Li.

3. The piezoelectric ceramic electronic component according to claim 2, wherein a Li concentration in the piezoelectric ceramic layer sandwiched between the adjacent electrodes is 0.03 wt % to 0.06 wt %.

4. The piezoelectric ceramic electronic component according to claim 2, wherein the at least one piezoelectric ceramic layer sandwiched between the adjacent electrodes has a segregation region where a Mn/Li concentration ratio is 4 or more in terms of molar ratio.

5. The piezoelectric ceramic electronic component according to claim 4, wherein a thickness of the segregation region is 0.50 times or more a thickness of the at least one piezoelectric ceramic layer.

6. The piezoelectric ceramic electronic component according to claim 1, wherein the plurality of electrodes are inside the piezoelectric ceramic body.

7. The piezoelectric ceramic electronic component according to claim 6, further comprising:
a plurality of external electrodes on the surface of the piezoelectric ceramic body, and wherein
the at least one piezoelectric ceramic layer sandwiched between the adjacent electrodes is also sandwiched between the plurality of external electrodes.

8. The piezoelectric ceramic electronic component according to claim 1, wherein the plurality of electrodes are on the surface of the piezoelectric ceramic body.

9. The piezoelectric ceramic electronic component according to claim 1, wherein the ceramic sintered body contains more than 50 mol % to 99 mol % of the potassium sodium niobate-based compound.

10. The piezoelectric ceramic electronic component according to claim 1, wherein the ceramic sintered body contains 2 mol % to 15 mol % of the Mn.

11. The piezoelectric ceramic electronic component according to claim 1, wherein the ceramic sintered body contains more than 50 mol % to 99 mol % of the potassium sodium niobate-based compound, 2 mol % to 15 mol % of the Mn, and has a particle size of 0.01 μm to 10 μm.

12. The piezoelectric ceramic electronic component according to claim 1, wherein, when the first Mn concentration in the first region is defined as $c_{m1}$, the second Mn concentration in the second region is defined as $c_{m2}$, and the third Mn concentration in the third region is defined as $c_{m3}$, each of $c_{m2}/c_{m1}$ and $c_{m2}/c_{m3}$ is larger than 1.0 and 2.0 or less.

* * * * *